US012696705B2

(12) United States Patent (10) Patent No.: US 12,696,705 B2
Kwon et al. (45) Date of Patent: Jul. 28, 2026

(54) METHOD OF WAFER DICING AND MANUFACTURING METHOD OF SEMICONDUCTOR DEVICES USING THE SAME

(71) Applicant: SAMSUNG ELECTRONICS CO., LTD., Suwon-si (KR)

(72) Inventors: Youngchul Kwon, Suwon-si (KR); Jimin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 458 days.

(21) Appl. No.: 18/496,531

(22) Filed: Oct. 27, 2023

(65) Prior Publication Data

US 2024/0290658 A1 Aug. 29, 2024

(30) Foreign Application Priority Data

Feb. 23, 2023 (KR) ......................... 10-2023-0024588

(51) Int. Cl.
*H10P 54/20* (2026.01)
(52) U.S. Cl.
CPC .................................... *H10P 54/20* (2026.01)
(58) Field of Classification Search
CPC .. B23K 26/364; B23K 26/53; H10P 54/00–30
See application file for complete search history.

(56) References Cited

U.S. PATENT DOCUMENTS

| | | | |
|---|---|---|---|
| 9,138,913 B2 | 9/2015 | Arai et al. | |
| 10,010,971 B1 | 7/2018 | Hosseini | |
| 10,179,374 B2 | 1/2019 | Bovatsek et al. | |
| 2002/0115235 A1 * | 8/2002 | Sawada ................... H10P 54/00 | |
| | | | 257/E21.599 |
| 2003/0019848 A1 | 1/2003 | Nicholas et al. | |
| 2007/0170162 A1 | 7/2007 | Haupt et al. | |
| 2016/0158880 A1 | 6/2016 | Koitzsch et al. | |

FOREIGN PATENT DOCUMENTS

WO WO-2013043173 A1 * 3/2013 .............. H10P 54/00

* cited by examiner

*Primary Examiner* — Daniel P Shook
(74) *Attorney, Agent, or Firm* — Morgan, Lewis & Bockius LLP

(57) ABSTRACT

Provided is a method of dicing a wafer, the method including preparing a wafer having a plurality of device formation regions and a scribe lane region defining the plurality of device formation regions, forming a plurality of semiconductor devices in the plurality of device formation regions of the wafer, irradiating a first laser beam and a second laser beam of a wavelength different from the first laser beam along the scribe lane region to form a plurality of internal cracks in the wafer, and separating the plurality of semiconductor devices along the plurality of internal cracks, wherein the first laser beam includes a plurality of pulses sequentially emitted from a laser apparatus, and the second laser beam is continuous wave light emitted from the laser apparatus.

20 Claims, 14 Drawing Sheets

FIG. 2

START

FORMATION OF SEMICONDUCTOR
DEVICE ON WAFER    — P10

FORMATION OF INTERNAL
CRACKS WITHIN WAFER    — P20

SEPARATION OF
SEMICONDUCTOR DEVICES    — P30

PACKAGING OF
SEMICONDUCTOR DEVICES    — P40

END

METHOD OF WAFER DICING AND MANUFACTURING METHOD OF SEMICONDUCTOR DEVICES USING THE SAME

CROSS-REFERENCE TO RELATED APPLICATION

This U.S. patent application claims priority under 35 U.S.C. § 119 to Korean Patent Application No. 10-2023-0024588, filed on Feb. 23, 2023, in the Korean Intellectual Property Office, the disclosure of which is incorporated by reference in its entirety herein.

1. TECHNICAL FIELD

The inventive concept relates to a wafer dicing method and a method of manufacturing a semiconductor device using the same, and more particularly, to a wafer dicing method performing a stealth dicing process and a method of manufacturing a semiconductor device using the same.

2. DISCUSSION OF RELATED ART

Laser processing refers to processing the shape or a physical property of a surface of a workpiece by scanning the surface with a laser beam. The laser processing may include: forming a pattern on the surface of the workpiece; using wafer annealing to modify the physical properties of the workpiece; changing the shape of the workpiece using heat; cutting the workpiece into a plurality of units using heat, etc.

A wafer dicing process is a process by which die are separated from a wafer of a semiconductor. In a wafer dicing process using a laser beam, the workpiece is cut by irradiating the workpiece with laser light in a wavelength range with a high absorption rate and subjecting the workpiece to heating and melting. However, when the wafer is cut by thermal cutting, not only the cut area but also the surrounding area is melted, causing damage to a portion of semiconductor devices formed on the wafer.

SUMMARY

According to an aspect of the inventive concept, there is provided a method of dicing a wafer including: forming a plurality of semiconductor devices in a plurality of device formation regions of a wafer having a scribe lane region defining the plurality of device formation regions; irradiating a first laser beam and a second laser beam of a wavelength different from the first laser beam along the scribe lane region to form a plurality of internal cracks in the wafer; and separating the plurality of semiconductor devices along the plurality of internal cracks. The first laser beam includes a plurality of pulses sequentially emitted from a laser apparatus, and the second laser beam is continuous wave light that is emitted from the laser apparatus.

According to an aspect of the inventive concept, there is provided a method of manufacturing a semiconductor device including: forming a plurality of semiconductor devices in a plurality of device formation regions of the wafer having a scribe lane region defining the plurality of device formation regions; irradiating a first laser beam and a second laser beam along the scribe lane region to form a plurality of horizontally spaced apart internal cracks in the wafer, where the first laser beam is pulsed wave light having a wavelength in a range of about 800 nm to about 1200 nm and includes a plurality of pulses, and the second laser beam is continuous wave light having a wavelength in a range of about 1400 nm to about 2000 nm; separating the plurality of semiconductor devices along the plurality of internal cracks; and packaging each of the plurality of separated semiconductor devices.

According to an aspect of the inventive concept, there is provided a method of manufacturing a semiconductor device including: forming a plurality of semiconductor devices in a plurality of device formation regions a the wafer having a scribe lane region defining the plurality of device formation regions; irradiating a first laser beam and a second laser beam along the scribe lane region to form a plurality of horizontally spaced apart internal cracks in the wafer, where the first laser beam is pulsed wave light having a wavelength in a range of about 800 nm to about 1200 nm and includes a plurality of pulses, and the second laser beam is continuous wave light having a wavelength in a range of about 1400 nm to about 2000 nm; separating the plurality of semiconductor devices along the plurality of internal cracks; and packaging each of the plurality of separated semiconductor devices. The first laser beam is irradiated so as to be focused on a focusing point that is one point of the scribe lane region, and the second laser beam is not focused on the focusing point but is irradiated along the scribe lane region prior to the plurality of pulses of the first laser beam.

BRIEF DESCRIPTION OF THE DRAWINGS

Embodiments will be more clearly understood from the following detailed description taken in conjunction with the accompanying drawings in which:

FIG. 2 is a schematic diagram illustrating a wafer processing apparatus in which a wafer dicing process is performed, according to an embodiment;

DETAILED DESCRIPTION OF THE EMBODIMENTS

Figure 1:
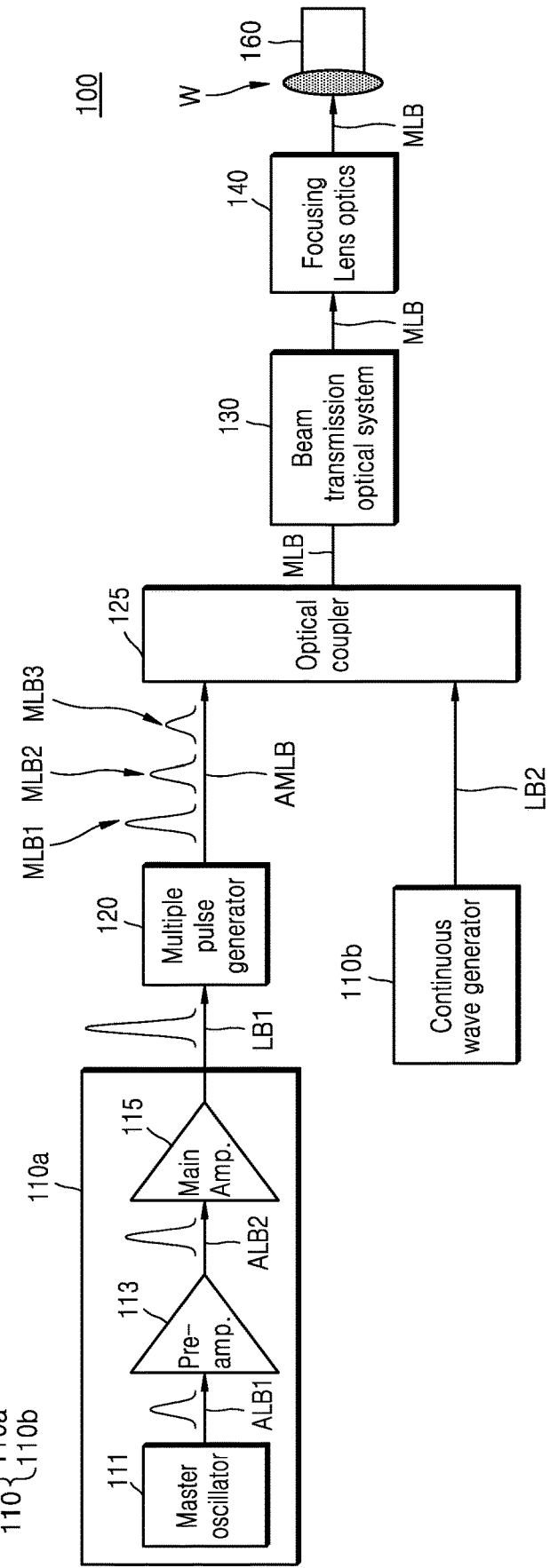
FIG. 1 is a block diagram illustrating a wafer processing apparatus in which a wafer dicing process is performed, according to an embodiment.

Hereinafter, embodiments will be described in detail below with reference to the accompanying diagrams. Identical components in the diagrams are designated by the same reference numerals, and duplicate descriptions thereof are omitted.

FIG. 1 is a block diagram illustrating a wafer processing apparatus in which a wafer dicing process is performed, according to an embodiment.

Referring to FIG. 1, a wafer processing apparatus 100 may include a first laser apparatus 110a, a second laser apparatus 110b, a multiple pulse generator 120, an optical coupler 125, a beam transmission optical system 130, a focusing lens optics 140, and a wafer support 160.

The wafer processing apparatus 100 may perform a wafer dicing process. In an embodiment, the wafer processing apparatus 100 performs a stealth dicing process. The stealth dicing process may include separating a wafer W, on which a semiconductor device is formed, at high precision and high speed. The stealth dicing process may focus a laser beam in a wavelength band that penetrates the wafer W through the surface of the wafer W to a spot inside the wafer W. The wavelength band may be in a band in which the absorption rate of the wafer W is low.

In the stealth dicing process, a small area of the wafer W is repeatedly irradiated with laser pulses lasting a very short time (e.g., 1 µs or less). In other words, the laser beam may have a high peak power density, for example, about $1 \times 108$ [W/cm$^2$], spatially (via focusing) and temporally (via pulsing), in the vicinity of a focal point located inside the wafer W. When the laser beam has a high peak power density it may cause a nonlinear absorption effect on the wafer W in the vicinity of the focal point, such that the laser beam that has been transmitted through the surface of the wafer W may be absorbed at a high absorption rate in the vicinity of the focal point inside the wafer W. This may result in high-density defects (e.g., dislocations) in the absorbed portion of the laser beam within the wafer W and may result in vertical cracking of the wafer W.

In an embodiment, the first laser apparatus 110a is a Master Oscillator and Power Amplifier (MOPA) laser. The first laser apparatus 110a may include a master laser (or a seed laser) and an optical amplifier to boost power of the master laser. In an embodiment, the second laser apparatus 110b is a continuous wave generator or a continuous wave laser. The first laser apparatus 110a and the second laser apparatus 110b may each be an optical fiber laser. A master oscillator 111, a preamplifier 113, and a main amplifier 115 included in the first laser apparatus 110a may be coupled to each other in an optical fiber. However, the present disclosure is not limited thereto. For example, the first laser apparatus 110a may be a MOPA laser composed of a solid-state bulk laser and a bulk amplifier, or may be a MOPA laser composed of a tunable external cavity diode laser and a semiconductor optical amplifier. In addition, the second laser beam LB2 output from the second laser apparatus 110b may be coupled to an optical fiber. The first laser beam LB1 output from the first laser apparatus 110a and the second laser beam LB2 output from the second laser apparatus 110b may be coupled in the optical coupler 125.

In some embodiments, the master oscillator 111 may include an optical fiber laser doped with any one of ytterbium (Yb), erbium (Er), thulium (Tm), and holmium (Ho). In an embodiment, the master oscillator 111 is configured to generate a first pre-laser beam ALB1 having a wavelength of about 0.8 µm to about 1.4 µm. In an embodiment, the wavelength of the first laser beam LB1 is less than the wavelength of the second laser beam LB2. In an embodiment, the first pre-laser beam ALB1, the second pre-laser beam ALB2, and the first laser beam LB1 have a wavelength in a range of about or precisely 1400 nm to about or precisely 2000 nm. In an embodiment, the second laser beam LB2 has a wavelength in a range of about or precisely 800 nm to about or precisely 1200 nm.

In an embodiments, the master oscillator 111 operates in a Q-switching method. In an embodiment, energy is stored in a laser material of the first laser apparatus 110a during pumping in the form of atoms in an upper laser level and suddenly released in a single, short burst during the Q-switching method. In an embodiment, the first laser apparatus 110a generates the first pre-laser beam ALB1 with a pulse frequency of several hundred kHz. In an embodiment, the master oscillator 111 operates with a mode-locking method but is not limited thereto. In an embodiment, the first laser apparatus 110a is operated to produce pulses of light of short duration such as in the order of picoseconds or femtoseconds during the mode-locking method.

The master oscillator 111 may include a seed laser diode, an optical fiber including a gain medium, and first and second mirrors opposite to each other to resonate the first laser beam LB1. The seed laser diode may be a diode that generates a laser using a forward semiconductor concatenate as the active medium. When current is applied to the seed laser diode, light may be emitted as an inversion between the high-energy level density and the low-energy level density occurs in the semiconductor concatenate.

The light emitted by the seed laser diode may be used as pumping energy for the optical fiber including the gain medium. The seed laser diode may include a plurality of seed laser diodes. When the seed laser diode includes the plurality of seed laser diodes, a pump-signal coupler may be located between the plurality of seed laser diodes and the optical fiber. The pump-signal coupler may combine optical signals output from the plurality of seed laser diodes into a single signal and transfer the single signal to the optical fiber including the gain medium.

The spontaneously emitted or inductively emitted light in the gain medium of the optical fiber may largely have weak directionality. By reflecting light emitted from the gain medium back into the gain medium, the first and second mirrors may generate resonance in which the induced emission of the gain material is repeated. A portion of the light that is repeatedly reflected between the first and second mirrors may pass through the second mirror and be output as the first pre-laser beam ALB1. The first pre-laser beam ALB1 may be coherent light.

The master oscillator 111 may further include an optical modulator configured to adjust an intensity-time profile of the first pre-laser beam ALB1. The optical modulator may include an aperture through which the first pre-laser beam ALB1 may be passed or shielded. The intensity-time profile of the pulses of the first pre-laser beam ALB1 may be adjusted through the aperture. The transmittance of the first pre-laser beam ALB1 may be adjusted through the aperture.

The preamplifier 113 may include a first pump laser diode and the main amplifier 115 may include a second pump laser diode. In an embodiment, the preamplifier 113 includes a plurality of first pump laser diodes. In an embodiment, the main amplifier 115 includes a plurality of second pump laser diodes.

The preamplifier 113 may amplify the first pre-laser beam ALB1 to output the second pre-laser beam ALB2. In an embodiment, the second pre-laser beam ALB2 has the same wavelength as the first pre-laser beam ALB1. The main amplifier 115 may amplify the second pre-laser beam ALB2 to output the first laser beam LB1. In an embodiment, the first laser beam LB1 has the same wavelength as the second pre-laser beam ALB2.

The first pre-laser beam ALB1, the second pre-laser beam ALB2, and the first laser beam LB1 may have the same intensity-time profile by adjusting the amplification ratio. For example, the first pre-laser beam ALB1, the second pre-laser beam ALB2, and the first laser beam LB1 may have substantially the same pulse width, kurtosis, and skewness. However, the first pre-laser beam ALB1, the second pre-laser beam ALB2, and the first laser beam LB1 are not limited thereto. For example, either of the first and second pre-laser beams LB1 and LB2 may have a different pulse width, kurtosis, and skewness than the first laser beam LB1.

In an embodiment, a first pump laser diode included in the preamplifier 113 generates a first pump laser beam. In an embodiment, a second pump laser diode included in the main amplifier 115 generates a second pump laser beam. The first pump laser beam may be joined to the optical path of the first pre-laser beam ALB1 by an optical coupler and the second pump laser beam may be joined to the optical path of the second pre-laser beam ALB2 by an optical coupler. The first and second pump laser diodes may be driven by radio frequency (RF) power.

In an embodiment, the first and second pump laser beams have a different wavelength than the first pre-laser beam ALB1. In an embodiment, the first and second pump laser beams have a shorter wavelength than the first pre-laser beam ALB1. In an embodiment, the first and second pump laser beams have a wavelength that has a higher absorption rate by the optical fiber than the first laser beam LB1. When the first pump laser beam is absorbed by the optical fiber, the first pre-laser beam ALB1 may be amplified to output the second pre-laser beam ALB2. When the second pump laser beam is absorbed by the optical fiber, the second pre-laser beam ALB2 may be amplified and the first laser beam LB1 may be output. However, the first and second pump laser beams are not limited thereto. For example, the first and second pump laser beams may have the same wavelength as the first pre-laser beam ALB1.

In an embodiment, isolators are positioned between the master oscillator 111 and the preamplifier 113 and between the preamplifier 113 and the main amplifier 115, respectively. An isolator, may also be referred to as an optical diode. In an embodiment, the optical diode is an optical component via which light is transmitted in only one direction. The isolators may prevent reverse propagation of the first laser beam LB1 and the second pre-laser beam ALB2.

In an embodiment, additional preamplifiers are positioned between the preamplifier 113 and the main amplifier 115, depending on the intensity of the first laser beam LB1 to be ultimately output by the first laser apparatus 110a. For example, the first laser apparatus 110a may include two or more preamplifiers. At the output end where the first laser beam LB1 is output from the first laser apparatus 110a, an isolator and a collimator may be provided.

In an embodiment, the intensity-time profile (hereinafter referred to as a time profile) of a single pulse included in the first pre-laser beam ALB1, the second pre-laser beam ALB2, and the first laser beam LB1 may exhibit a Gaussian distribution. In some embodiments, the time profile of the single pulse may differ from a Gaussian distribution. In some embodiments, the time profile of the single pulse may differ from a Lorentzian distribution.

In an embodiments, a full width at half maximum (FWHM) of the single pulse is in a range of about or precisely 1 picosecond (ps) to about or precisely 1 microsecond (μs). In an embodiment, the FWHM of the single pulse is about or precisely 500 nanosecond (ns) or less.

In an embodiments, the time profile of the single pulse is symmetrical with respect to the center of the pulse. Here, the center of a pulse refers to the midpoint of the start point and the end point of the pulse. In an embodiments, the time profile of the single pulse is asymmetrical with respect to the center of the pulse. For example, the time interval from the start point (SP) of the single pulse to a peak point (PP) of the intensity may be less than the time interval from the PP of the intensity to the end point (EP) of the single pulse. Alternatively, for example, the time interval from the SP of the single pulse to the PP of the intensity may be greater than the time interval from the PP of the intensity to the EP of the single pulse.

In an embodiments, a rise time of the FWHM of the single pulse is greater than about or precisely 1%, and less than about or precisely 50%. In an embodiment, the rise time refers to the time it takes for the intensity of the single pulse to increase from 10% of the PP to 90% of the PP. In an embodiment, the peak power of a single pulse included in the first laser beam LB1 is in a range of about or precisely 1 W to about or precisely 1 kW. In an embodiment, the average power of the single pulse is in a range of about or precisely 1 W to about or precisely 60 W. In an embodiment, the power of the second laser beam LB2 is in a range of about or precisely 5 W to about or precisely 10 W.

The first laser apparatus 110a may repeatedly output the first laser beam LB1 at constant or generally constant time intervals. In some embodiments, the first laser apparatus 110a may repeatedly output the first laser beam LB1 for a time interval of several or more μs. For example, the first laser apparatus 110a may repeatedly output the first laser beam LB1 at intervals of about or precisely 10 μs to about or precisely 30 μs. In an embodiment, the second laser apparatus 110b continuously outputs a second laser beam LB2 prior to the first laser beam LB1. For example, the second laser apparatus 110b may begin outputting the second laser beam LB2 before the first laser beam LB1 is output.

The first laser beam LB1 output from the first laser apparatus 110a may be transferred to the multiple pulse generator 120. The multiple pulse generator 120 may split and delay the transferred first laser beam LB1 to generate a plurality of pulses AMLB. The plurality of pulses AMLB may include a plurality of pulsed laser beams MLB1, MLB2, and MLB3.

In addition, the multiple pulse generator 120 may receive a first laser beam LB1 that is repeatedly output from the first laser apparatus 110a at constant or generally constant time intervals to repeatedly generate the plurality of pulses AMLB including the plurality of pulsed laser beams MLB1, MLB2, and MLB3. The multiple pulse generator 120 may repeatedly generate the plurality of pulses AMLB including the plurality of pulsed laser beams MLB1, MLB2, and MLB3 at time intervals of several or more μs. For example, the multiple pulse generator 120 may repeatedly generate a plurality of pulses AMLB including the plurality of pulsed laser beams MLB1, MLB2, and MLB3 at intervals of about or precisely 10 μs to about or precisely 30 μs and transfer the plurality of pulses AMLB to the optical coupler 125. In addition, the second laser apparatus 110b may continuously generate a second laser beam LB2 and transfer the second laser beam LB2 to the optical coupler 125. In an embodiment, the optical coupler 125 couples the first laser beam LB1 to the second laser beam LB2 to generate a multi-pulse laser beam MLB. In other words, the multi-pulse laser beam MLB may refer to a laser beam coupled with a plurality of pulses AMLB of a first laser beam LB1 and continuous light of a second laser beam LB2.

The time profile of each of the plurality of pulsed laser beams MLB1, MLB2, and MLB3 may have a similar shape to the time profile of the first laser beam LB1, but the peak power of each of the plurality of pulsed laser beams MLB1, MLB2, and MLB3 may be smaller than the peak power of the first laser beam LB1. The time profiles of each of the plurality of pulsed laser beams MLB1. MLB2, and MLB3 may have similar shapes, but the peak powers of the plurality of pulsed laser beams MLB1, MLB2, and MLB3 may be different.

The plurality of pulsed laser beams MLB1, MLB2, and MLB3 include a first pulsed laser beam MLB1, a second pulsed laser beam MLB2, and a third pulsed laser beam MLB3. The plurality of pulses AMLB are illustrated herein as including three pulsed laser beams, namely, a first pulsed laser beam MLB1, a second pulsed laser beam MLB2, and a third pulsed laser beam MLB3. However, the plurality of pulses AMLB is not limited thereto. For example, the plurality of pulses AMLB may have two pulsed laser beams, or four or more pulsed laser beams.

The plurality of pulsed laser beams MLB1, MLB2, and MLB3, including the multi-pulse laser beam MLB, may have time profiles of the same, similar or generally similar shapes, but with sequentially decreasing peak power. For example, the time profiles of each of the first pulsed laser beam MLB1, the second pulsed laser beam MLB2, and the third pulsed laser beam MLB3 may have the same or similar shapes. For example, the peak power of the first pulsed laser beam MLB1 may be greater than the peak power of each of the second pulsed laser beam MLB2 and the third pulsed laser beam MLB3, and the peak power of the second pulsed laser beam MLB2 may be less than the peak power of the first pulsed laser beam MLB1 and greater than the peak power of the third pulsed laser beam MLB3, the peak power of the third pulsed laser beam MLB3 may be less than the peak power of the first pulsed laser beam MLB1 and the peak power of the second pulsed laser beam MLB2, respectively.

In an embodiment, the transfer time intervals between the plurality of pulsed laser beams MLB1, MLB2, and MLB3, including the multi-pulse laser beams MLB, is the same as each other. In an embodiment, the transfer time interval between the first pulsed laser beam MLB1 and the second pulsed laser beam MLB2 is the same as the transfer time interval between the second pulsed laser beam MLB2 and the third pulsed laser beam MLB3.

In an embodiment, the transfer time intervals between the plurality of pulsed laser beams MLB1, MLB2, and MLB3, including the multi-pulse laser beam MLB, gradually decreases. In an embodiment, the transfer time interval between the second pulsed laser beam MLB2 and the third pulsed laser beam MLB3 is smaller than the transfer time interval between the first pulsed laser beam MLB1 and the second pulsed laser beam MLB2.

In an embodiment, the transfer time interval refers to an interval of time between the transfers of the two pulsed laser beams to the same location. For example, the transfer time interval may refer to the interval between the times that the two pulsed laser beams are transferred to the optical coupler 125. The transfer time interval between the first pulsed laser beam MLB1 and the second pulsed laser beam MLB2 may refer to the interval between the time when the first pulsed laser beam MLB1 is transferred to the optical coupler 125 and the time when the second pulsed laser beam MLB2 is transferred to the optical coupler 125. A transfer time interval between the second pulsed laser beam MLB2 and the third pulsed laser beam MLB3 may refer to an interval between the time when the second pulsed laser beam MLB2 is transferred to the optical coupler 125 and the time when the third pulsed laser beam MLB3 is transferred to the optical coupler 125.

The coupled multi-pulse laser beam MLB from the optical coupler 125 may be transferred to the focusing lens optics 140 by the beam transmission optical system 130. The beam transmission optical system 130 may be implemented by free space optics, but is not limited thereto. The beam transmission optical system 130 may include various optical elements such as polarizers, lenses, reflectors, prisms, splitters, etc.

The focusing lens optics 140 may focus the multi-pulse laser beam MLB to a position located inside a wafer W. For example, the focusing lens optics 140 may focus each of the plurality of pulsed laser beams MLB1, MLB2, and MLB3 including the multi-pulse laser beam MLB at positions located inside the wafer W. The focusing lens optics 140 may be composed of a single lens, or may include a plurality of lenses. The wafer support 160 may support the wafer W while the wafer W is being processed.

Figure 2:
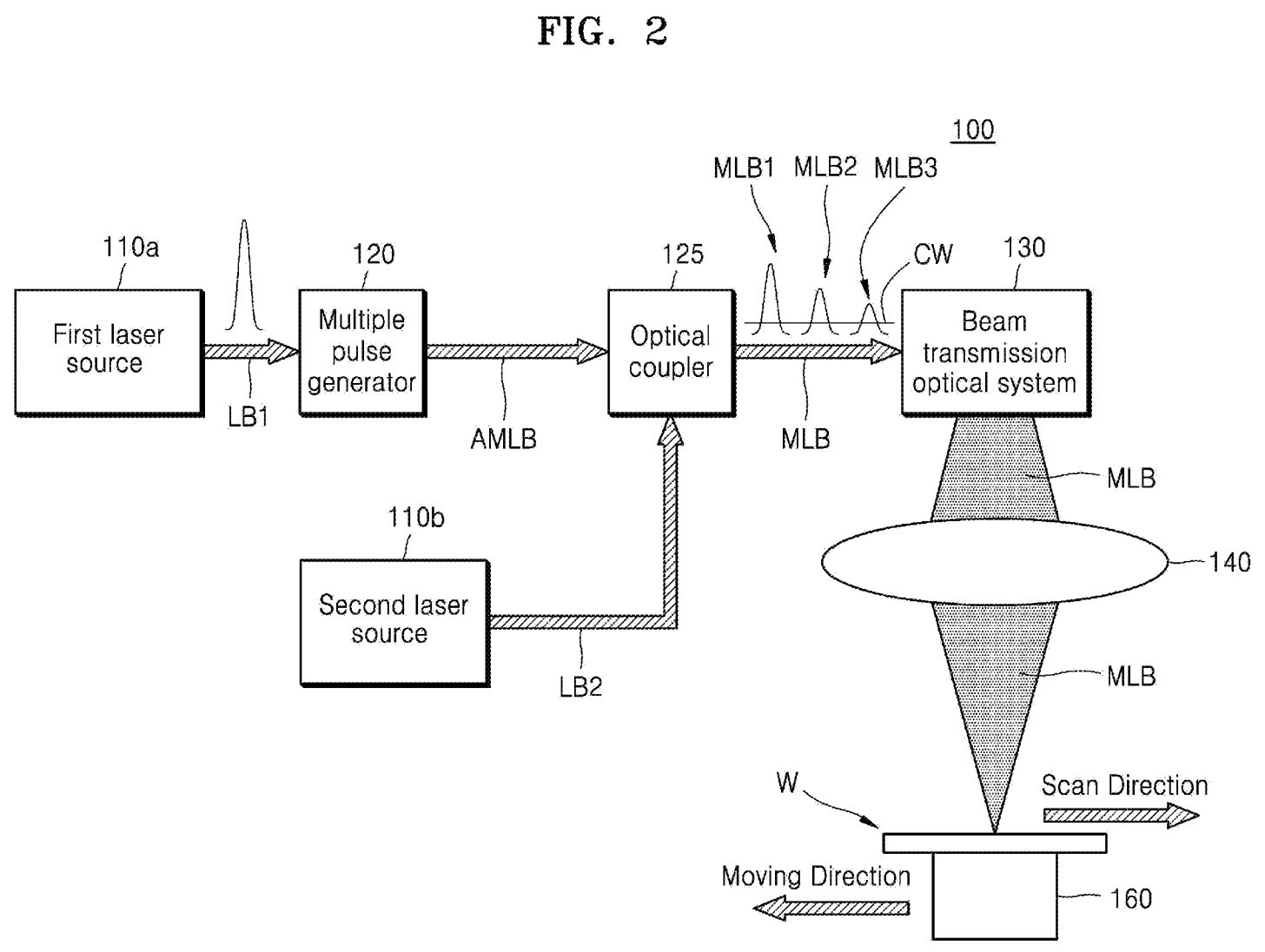

FIG. 2 is a schematic diagram illustrating a wafer processing apparatus in which a wafer dicing process is performed, according to an embodiment.

Referring to FIG. 2, a wafer processing apparatus 100 may include a first laser apparatus 110a (e.g., a first laser source), a second laser apparatus 110b (e.g., a second laser source), a multiple pulse generator 120, an optical coupler 125, a beam transmission optical system 130, a focusing lens optics 140, and a wafer support 160. The wafer processing apparatus 100 may perform a stealth dicing process.

In an embodiment, the first laser apparatus 110a is a MOPA laser. The first laser apparatus 110a may repeatedly output a first laser beam LB1 at constant or generally constant time intervals. In an embodiment, the second laser apparatus 110b outputs a second laser beam LB2 prior to the first laser beam LB1, but outputs the second laser beam LB2 continuously. The first laser beam LB1 output from the first laser apparatus 110a may be transferred to the multiple pulse generator 120. The multiple pulse generator 120 may split and delay the transferred first laser beam LB1 to convert the first laser beam LB1 into a multi-pulse laser beam MLB including a plurality of sub-laser beams MLB1, MLB2, and MLB3.

The multiple pulse generator 120 may repeatedly generate a plurality of pulses AMLB including the plurality of sub-laser beams MLB1, MLB2, and MLB3 and transfer the plurality of pulses AMLB to the optical coupler 125. In addition, the second laser apparatus 110b may transfer a second laser beam LB2 to the optical coupler 125. The optical coupler 125 may couple the plurality of pulses AMLB of a first laser beam LB1 and a second laser beam LB2 to generate a multi-pulse laser beam MLB.

The multi-pulse laser beam MLB to which the first laser beam LB1 and the second laser beam LB2 are coupled may be transferred to the focusing lens optics 140 by the beam transmission optical system 130. The focusing lens optics 140 may focus the multi-pulse laser beam MLB to a position located inside a wafer W. Here, the first laser beam LB1 of the multi-pulse laser beam MLB and the second laser beam LB2 of the multi-pulse laser beam MLB may be irradiated along a same optical path as each other. Here, the optical path may refer to the optical path to the beam transmission optical system 130, the focusing lens optics 140, and the wafer W.

The wafer support 160 may support the wafer W while the wafer W is being processed. The wafer support 160 may move the wafer W in the horizontal direction such that each of the plurality of sub-laser beams MLB1, MLB2, and MLB3, which may include a multi-pulse laser beam MLB, is focused on a different part or position inside the wafer W. Accordingly, the wafer W may be scanned along a scribe lane defined on the wafer W and cracks may be formed in different parts or positions inside the wafer W. In an embodiment, the direction of movement of the wafer support 160 is opposite to the scanning direction of the multi-pulse laser beam MLB.

Figure 3:
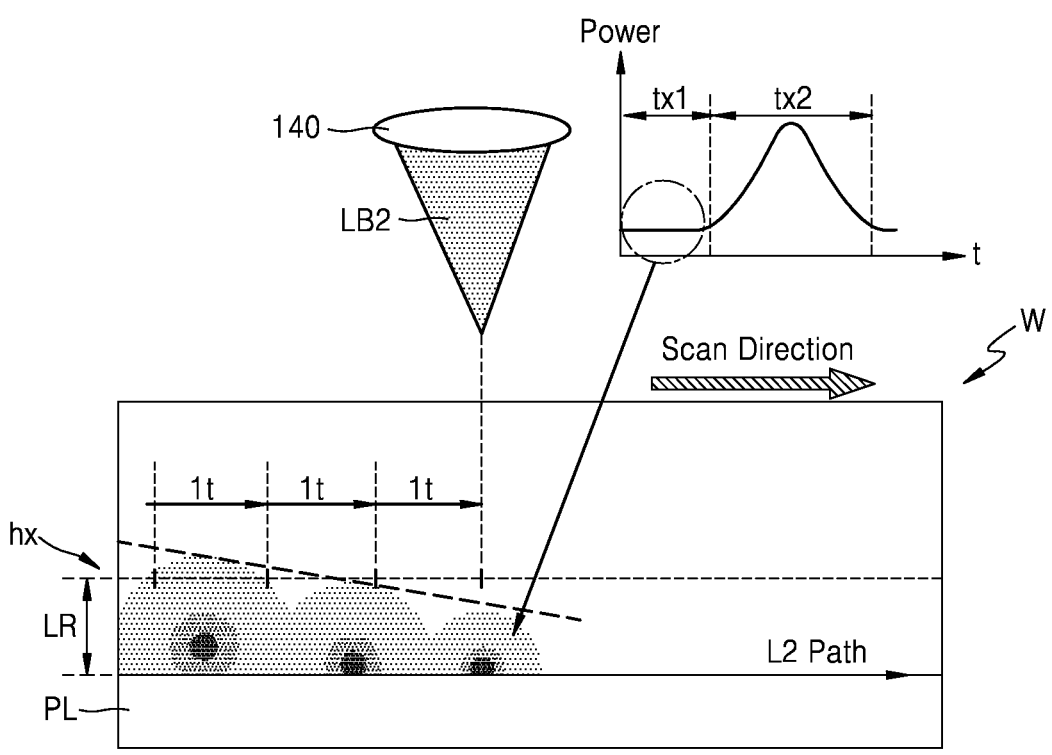
FIG. 3 is a schematic diagram illustrating a wafer dicing method using continuous wave light, according to an embodiment.
Figure 4:
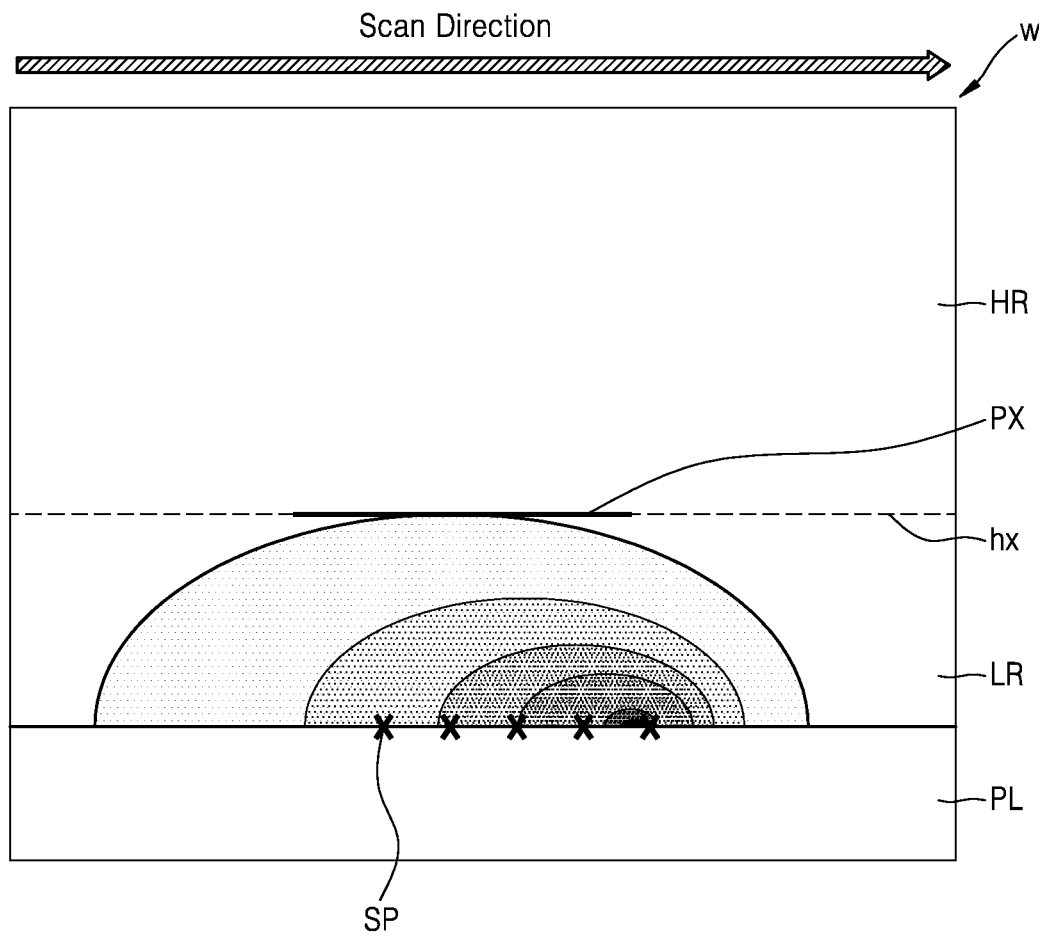
FIG. 4 is a diagram illustrating the temperature distribution by continuous wave light of the first laser beam of FIG. 3.

FIG. 3 is a schematic diagram illustrating a method of dicing a wafer using continuous wave light from a first laser beam, according to an embodiment. FIG. 4 is a diagram illustrating the temperature distribution by the continuous wave light of the first laser beam of FIG. 3. FIG. 1 and FIG. 2 will be described with reference to each other, and descriptions of FIG. 1 and FIG. 2 are briefly given or omitted.

Referring to FIG. 1 and FIG. 3, a wafer dicing process is performed in the wafer processing apparatus 100. In this case, the wafer processing apparatus 100 may irradiate the wafer W with a multi-pulse laser beam MLB. Here, the multi-pulse laser beam MLB is a laser beam to which a first laser beam LB1 and a second laser beam LB2 are coupled. In an embodiment, the second laser beam LB2, which precedes the first laser beam LB1, irradiates the wafer W for a first time period tx1. The second laser beam LB2 may be continuous wave light and may be irradiated onto the wafer W in the scanning direction. In an embodiment, the scanning direction of the first laser beam LB1 is the same as the scanning direction of the second laser beam LB2. In an embodiment, the second laser beam LB2 may be irradiated in a lower region of the focusing line hx. The focusing line hx refers to the horizontal line connecting a plurality of focusing points corresponding to target irradiation points of the first laser beam LB1. The second laser beam LB2 may heat the lower region LR of the focusing line hx. The lower region LR may refer to the region between the focusing line hx and a circuit layer PL.

In an embodiment, a portion of the second laser beam LB2 overlaps with a plurality of pulses AMLB of the first laser beam LB1. The remainder of the second laser beam LB2 does not overlap with the plurality of pulses AMLB of the first laser beam LB1. In an embodiment, after irradiating the second laser beam LB2 for a first time period tx1, the wafer W is irradiated with both the first laser beam LB1 and second laser beam LB2 for a second time period tx2.

In an embodiment, the second laser beam LB2 is irradiated while a plurality of pulses of the first laser beam LB1 are off-duty. In an embodiment, the second laser beam LB2 is irradiated while a plurality of pulses of the first laser beam LB1 are on-duty. In other words, the second laser beam LB2 may be irradiated continuously. For example, the second laser beam LB2 may be irradiated continuously while the first laser beam LB1 emits optical pulses.

Referring to FIG. 4, when the second laser beam LB2 heats the lower region LR in the scanning direction, the lower region LR is heated along the point SP where the second laser beam LB2 is irradiated. In FIG. 4, the darker regions indicate higher temperatures. In other words, since the second laser beam LB2 irradiates the continuous wave light in the scanning direction, it may be observed that heat is conducted horizontally and vertically in the scanning direction in the lower region LR. In addition, when the second laser beam LB2 irradiates the continuous wave light in the lower region LR by traveling a path px along the focusing line hx, it may be observed that the heat is overlapped in the scanning direction. In an embodiment, the second laser beam LB2 heats the lower region LR and does not heat the upper region HR. In an embodiment, the second laser beam LB2 does not heat the circuit layer PL. In an embodiment, the second laser beam LB2 heats the lower region LR of the focusing point in a range from about or precisely 40 K to about or precisely 120 K. In addition, in an embodiment, the second laser beam LB2 heats a plurality of internal cracks formed by the first laser beam LB1 and a region between the pluralities of internal cracks.

Referring again to FIG. 3, the first laser beam LB1 may be irradiated at a focusing point, which is any one point of the focusing line hx. The first laser beam LB1 may cause a phase shift in the focusing point in the scribe lane region of the wafer W and may form an internal crack. The first laser beam LB1 may form internal cracks at a plurality of different focusing points of the focusing line hx, and the plurality of semiconductor devices may be separated by the internal cracks. In this case, unlike the first laser beam LB1, the second laser beam LB2 is not focused on the focusing point, which is any one point of the scribe lane region. In other words, the focusing ability of the first laser beam LB1 may be greater than the focusing ability of the second laser beam LB2.

Figure 5:
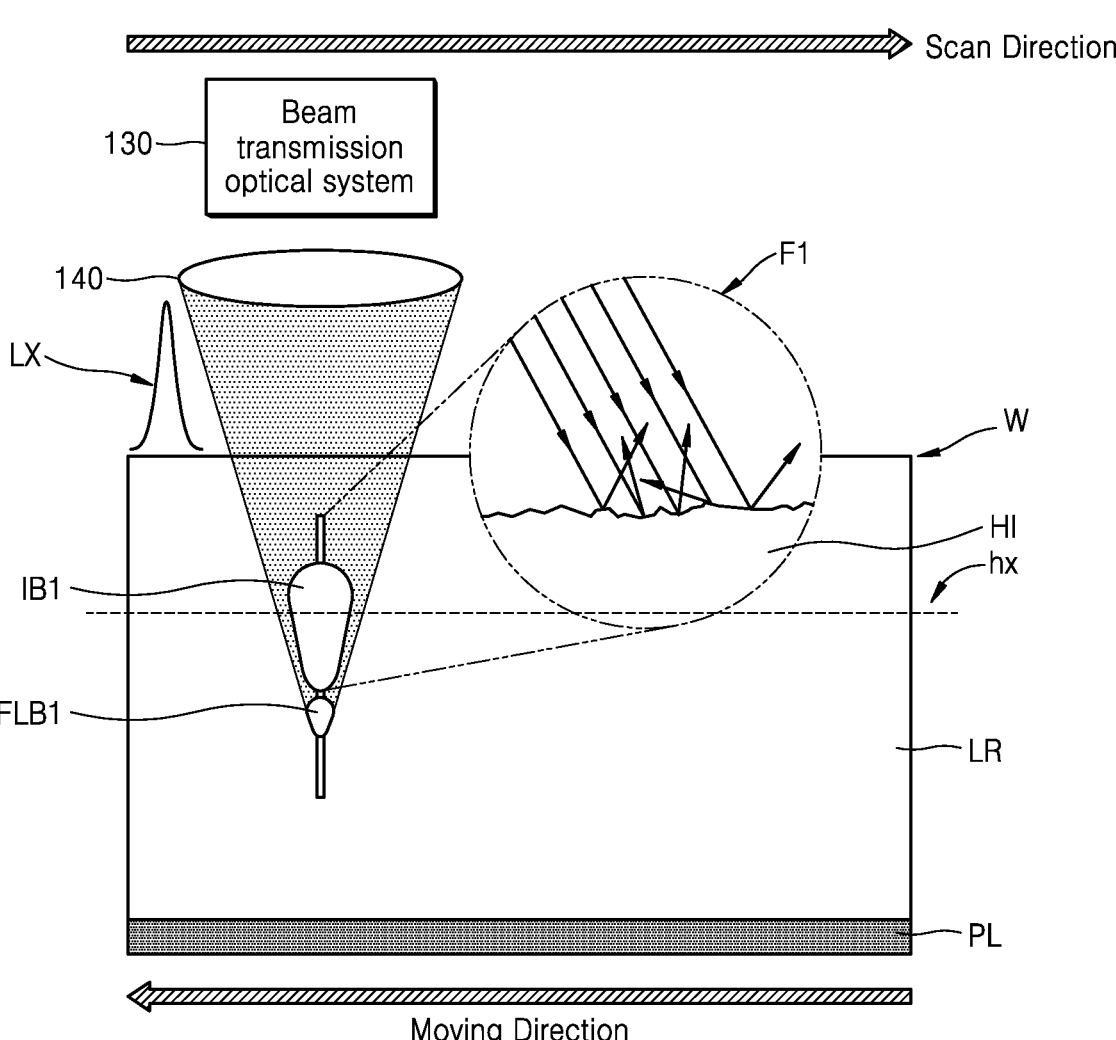
FIG. 5, FIG. 6A, and FIG. 6B are diagrams illustrating diffuse reflected light of a laser beam.
Figure 6A:
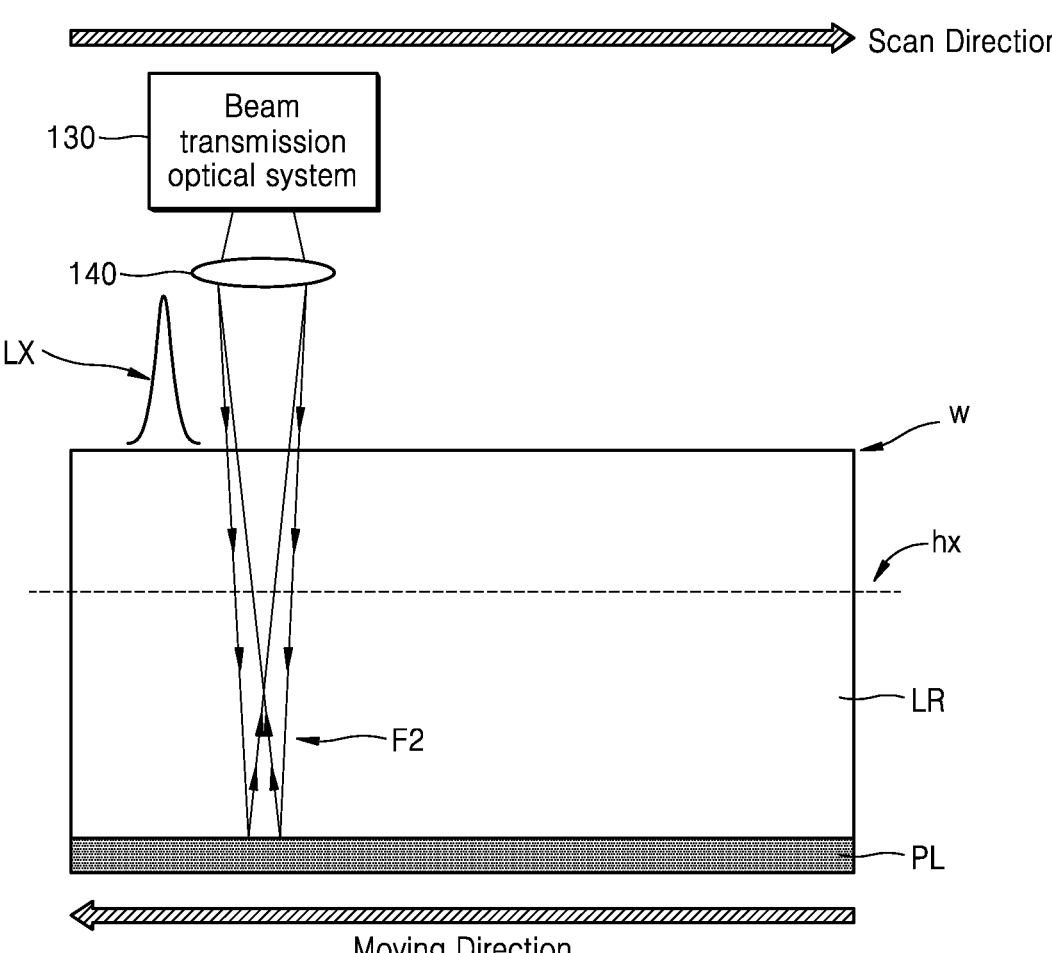
Figure 6B:
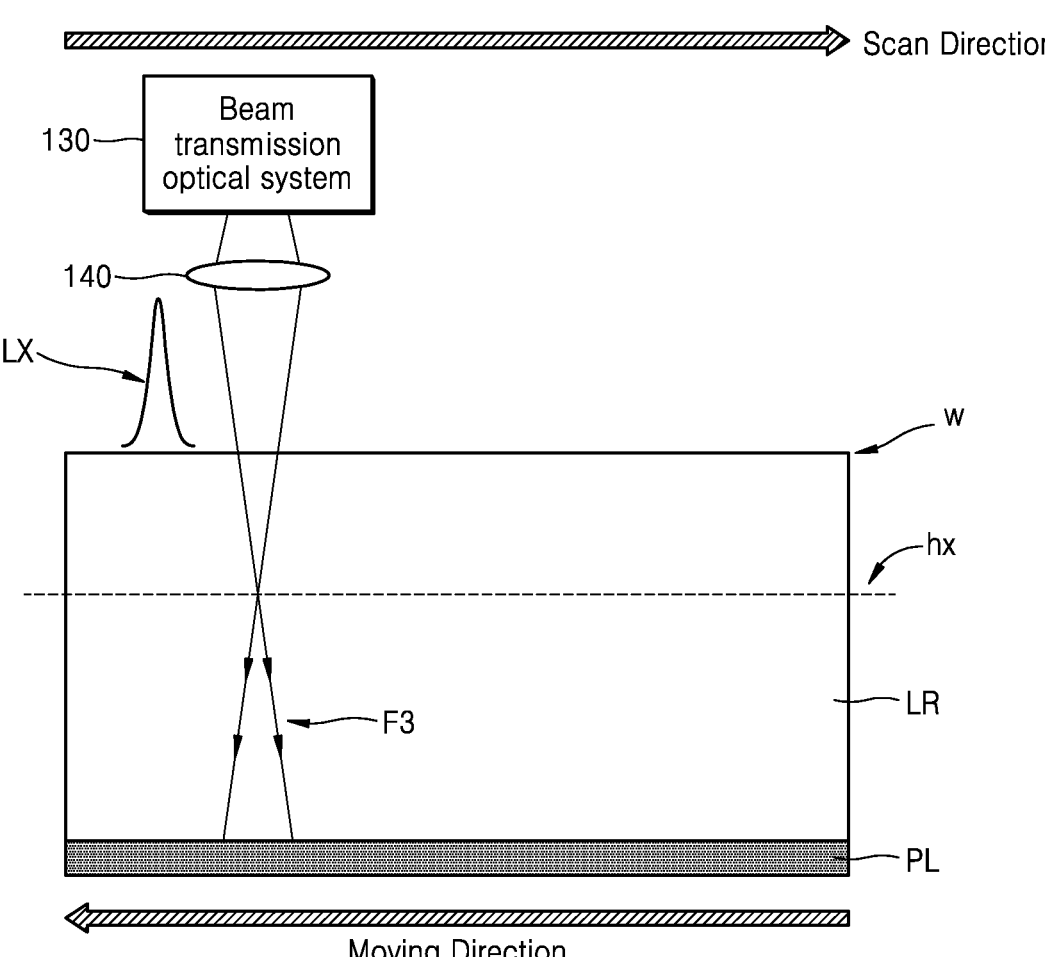

FIG. 5, FIG. 6A, and FIG. 6B are diagrams illustrating diffuse reflected light of a laser beam. FIG. 5, FIG. 6A, and FIG. 6B illustrate, by way of example, irradiation with one pulsed laser beam LX and no irradiation with a second laser beam LB2.

Referring to FIG. 5, a wafer W is irradiated with a single pulsed laser beam LX. An internal crack IB1 may be formed from the beam focus FLB1 of the one pulsed laser beam LX. One pulsed laser beam LX may cause a phase transition in the peripheral region of the beam focus FLB1, which may cause the internal crack IB1. At this time, the region where the phase shift and/or internal crack is formed may act as a heterogeneous interface HI, causing a phenomenon in which diffuse reflected light is generated F1 in the wafer W.

Referring to FIG. 6A and FIG. 6B, one pulsed laser beam LX may be irradiated at one of the focusing points on the focusing line hx. In this case, the one pulsed laser beam LX may include light that is irradiated onto the circuit layer PL by aberration when focused on the beam focus FLB1 from the focusing lens optics 140. In this case, the light irradiated on the circuit layer PL may cause a phenomenon of refocusing F2 in the lower region LR. In addition, the one pulsed laser beam LX may include light that is focused from the focusing lens optics 140 at any one of the focusing points of the focusing line hx but leaks to the bottom of the focusing line hx. As a result, a portion of the one pulsed laser beam LX may leak into the lower portion of the focusing line hx. For ease of explanation, one pulsed laser beam LX has been described as an example, however, diffuse reflected light may be generated with respect to a plurality of pulsed laser beams.

By irradiating the wafer W with a second laser beam LB2 prior to a plurality of pulses AMLB of the first laser beam LB1, at least one embodiment of the inventive concept may heat the lower region LR of the focusing line hx. By doing so, horizontal and vertical heat conduction in the lower region LR may be generated and diffuse reflected light may be absorbed by the lower region LR before the diffuse reflected light reaches the circuit layer PL, thereby preventing the diffuse reflected light from affecting the semiconductor device.

Figure 7:
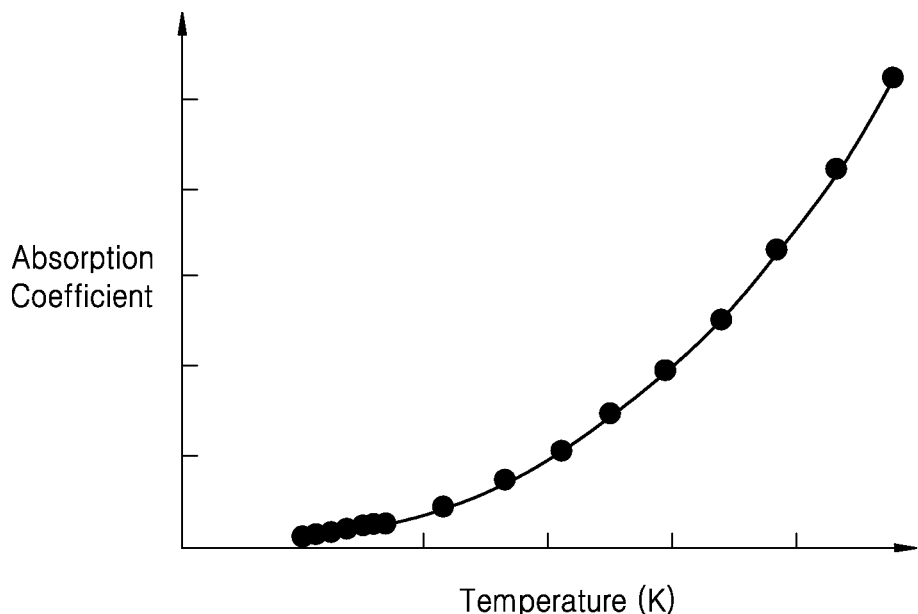
FIG. 7 is a graph illustrating the temperature dependent absorption rate of a wafer according to an embodiment.
Figure 8:
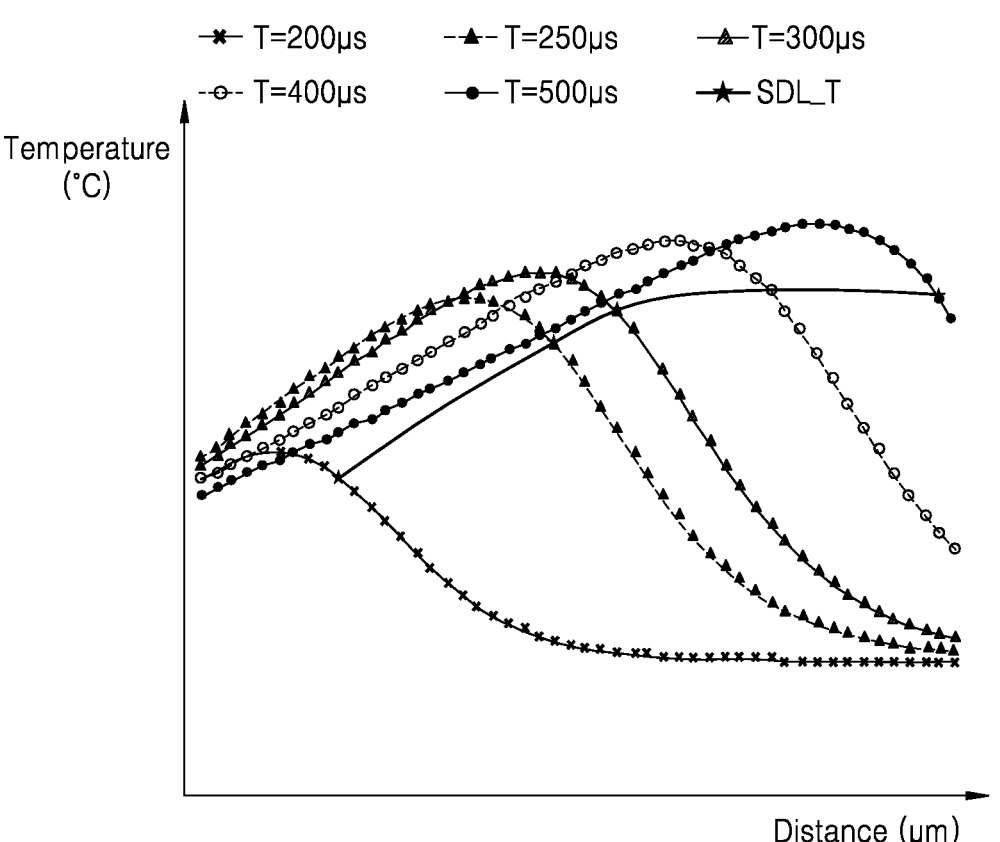
FIG. 8 and FIG. 9 are graphs illustrating the effectiveness of a wafer processing apparatus in which a wafer dicing process is performed, according to an embodiment.
Figure 9:
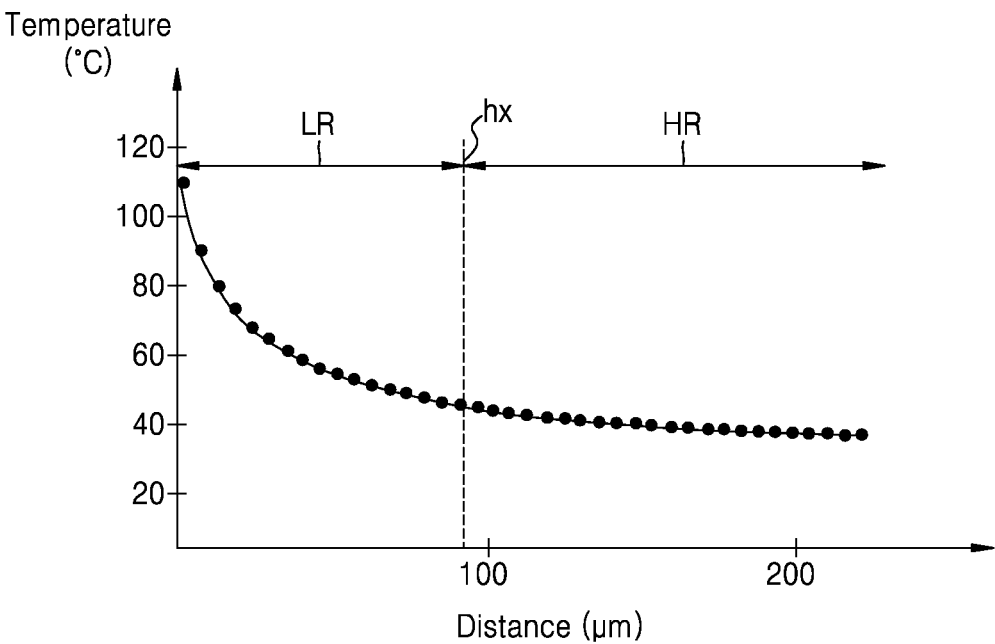

FIG. 7 is a graph illustrating a temperature-dependent absorption rate of a wafer according to an embodiment. FIG. 8 and FIG. 9 are graphs illustrating the effectiveness of a wafer processing apparatus in which a wafer dicing process is performed, according to an embodiment. FIG. 1, FIG. 2, and FIG. 4 are described with reference to each other, and descriptions of FIG. 1, FIG. 2, and FIG. 4 are briefly given.

Referring to FIG. 1 and FIG. 7, the horizontal axis represents the temperature of the wafer W in units of Kelvin (K). The vertical axis represents the light absorption rate of the wafer W, wherein the unit is an arbitrary unit (a.u.). From the graph, it may be observed that the absorption rate of the wafer W increases as the temperature increases.

Referring to FIG. 4 and FIG. 8, the horizontal axis represents the distance in the horizontal direction of the lower region LR of the scribe lane region of the wafer W and the unit is micrometers (μm). The vertical axis represents the temperature of the wafer W in degrees Celsius (° C.). On the graph, SDL_T represents the temperature of the wafer W at the time the second laser beam LB2 of the multi-pulse laser beam MLB is irradiated at the focusing point. From SDL_T, it may be observed that the first laser beam LB1 heats the lower region LR before the second laser beam LB2 is irradiated to the focusing point, resulting in an increase in the temperature of the lower region LR. It may be observed that the leftmost SDL_T has a relatively low temperature but gradually converges to a constant temperature.

Referring to FIG. 4 and FIG. 9, the horizontal axis represents the distance in the vertical direction of the scribe lane region of the wafer W and the unit is micrometers (μm). The vertical axis represents the temperature of the wafer W in degrees Celsius (° C.). FIG. 9 shows the state of the wafer W heated by the multi-pulse laser beam MLB, and it may be observed that the first laser beam LB1 of the multi-pulse laser beam MLB only increases the temperature of the lower region LR and has no effect on the temperature of the upper region HR above the focusing line hx which is the reference of the lower region LR.

Figure 10:
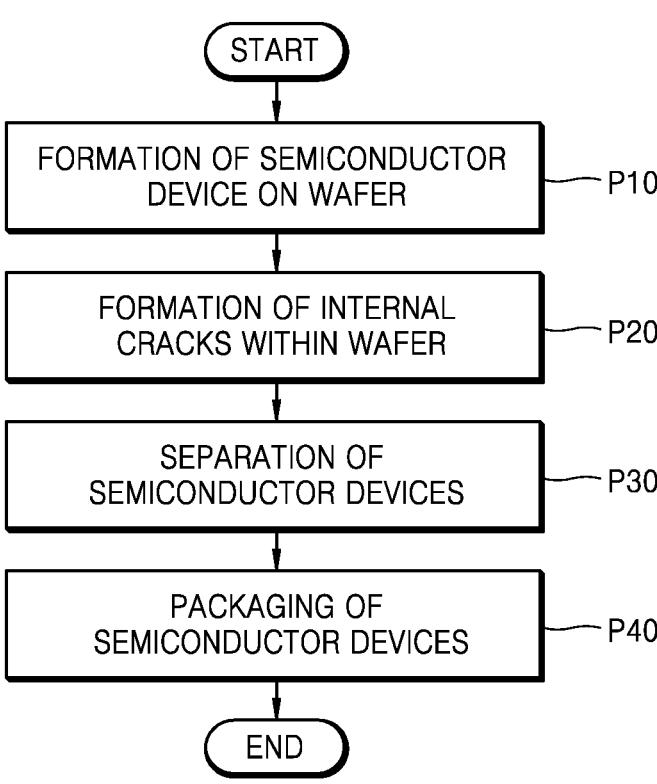
FIG. 10 is a flowchart illustrating a method of manufacturing a semiconductor device, according to an embodiment.
Figure 11:
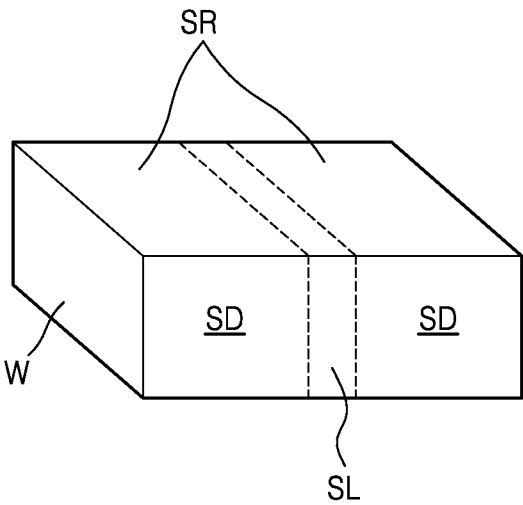
FIG. 11 to FIG. 13 are schematic diagrams illustrating a method of manufacturing a semiconductor device, according to an embodiment.
Figure 12:
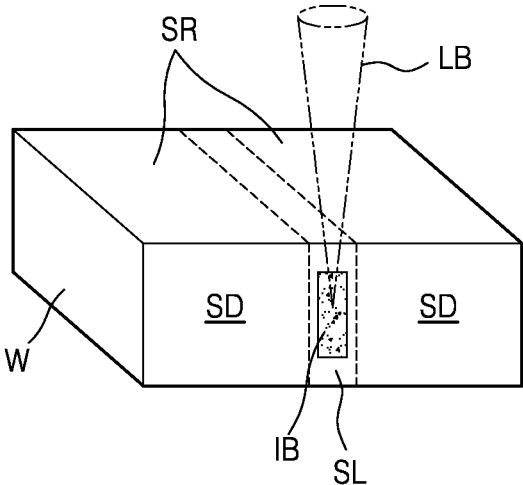
Figure 13:
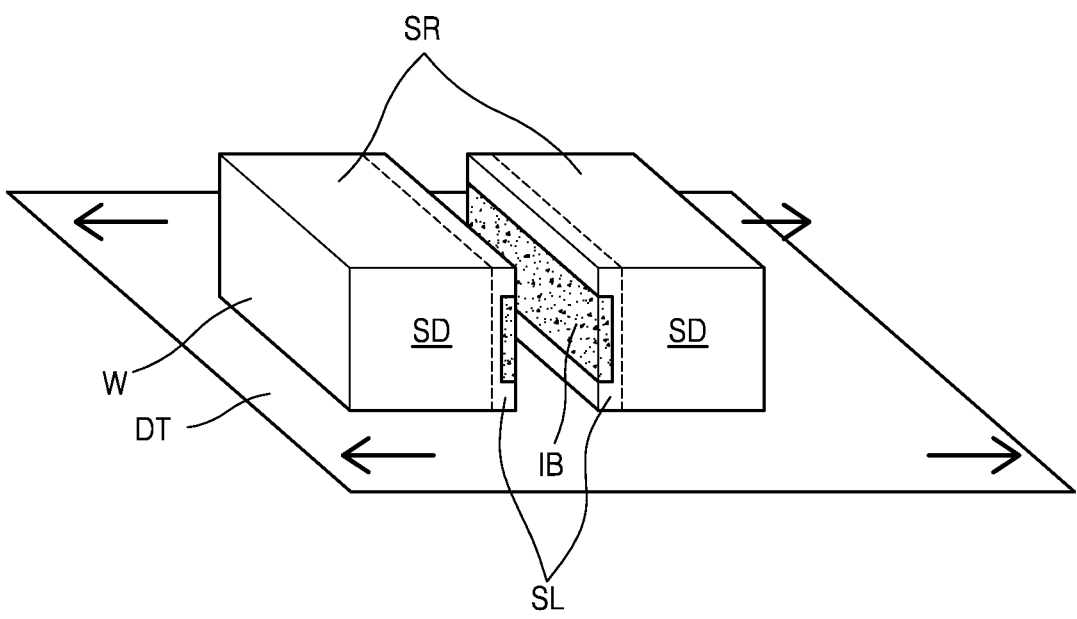

FIG. 10 is a flowchart illustrating a method of manufacturing a semiconductor device, according to an embodiment. FIG. 11 to FIG. 13 are schematic diagrams illustrating a method of manufacturing a semiconductor device, according to some embodiments.

Referring to FIG. 10 and FIG. 11 together, a plurality of semiconductor devices SD are formed on a wafer W (P10). The wafer W may include a plurality of device formation regions SR, in which each of the plurality of semiconductor devices SD is formed, and a scribe lane region SL defining the plurality of device formation regions SR.

The wafer W may include, for example, silicon (Si). The wafer W may include a semiconductor element, such as germanium (Ge), or a compound semiconductor, such as silicon carbide (SiC), gallium arsenide (GaAs), indium arsenide (InAs), and indium phosphide (InP).

In an embodiment, the wafer W is a silicon on insulator (SOI) structure. The wafer W may include a buried oxide layer formed on a front side of the wafer W. In some embodiments, the wafer W may include a conductive region formed on a front side of the wafer W, for example, a well doped with an impurity. In some embodiments, the wafer W may have various device isolation structures, such as a shallow trench isolation (STI), separating the doped wells from each other. Multiple material layers may be formed on the front side of the wafer W. At least one material layer may be formed on the back side of the wafer W.

The semiconductor device SD formed within the wafer W may be one of a memory device and a non-memory device. In some embodiments, the memory device may be a non-volatile memory semiconductor device such as flash memory, phase-change random access memory (PRAM), magnetoresistive random access memory (MRAM), ferroelectric random access memory (FeRAM), or resistive random access memory (RRAM). The flash memory may be, for example, vertical-NAND (V-NAND) flash memory. In some other embodiments, the memory device may be a volatile memory semiconductor device, such as dynamic random access memory (DRAM) or static random access memory (SRAM). The memory device may also be a volatile memory device that loses data when power thereto is interrupted. In some embodiments, the non-memory device may be a logic chip such as a central processing unit (CPU), a graphics processing unit (GPU), or an application processor (AP). In some embodiments, the non-memory device may be an instrumentation device, a communication device, a digital signal processor (DSP), or a system-on-chip (SoC).

The process of forming the semiconductor device SD may be an oxidation process to form an oxide film, spin coating, a lithographic process including exposure and development, a thin film deposition process, a dry or wet etching process, a metal wiring process, etc.

The oxidation process may be a process in which oxygen or water vapor chemically reacts with the surface of a silicon substrate at a high temperature of about or precisely 800 K to about or precisely 1200 K to form a thin, uniform silicon oxide film. The oxidation process may include dry oxidation and wet oxidation. Dry oxidation may react with oxygen gas to form an oxide film, and wet oxidation may react with oxygen and water vapor to form an oxide film.

In some embodiments, an SOI structure may be formed on a substrate by an oxidation process. The substrate may also include a buried oxide layer. In some embodiments, the substrate may have various device isolation structures, such as shallow trench isolation (STI) regions.

The lithographic process is a process of transferring a pre-formed circuit pattern on a lithography mask onto a substrate through exposure to light. The lithographic process may be performed in the order of spin coating, exposure, and development processes.

The thin film deposition process may be any of, for example, atomic layer deposition (ALD), chemical vapor deposition (CVD), plasma-enhanced CVD (PECVD), metal organic CVD (MOCVD), physical vapor deposition (PVD), reactive pulsed laser deposition, molecular beam epitaxy, and DC magnetron sputtering.

The dry etching process may be, for example, one of reactive ion etching (RIE), deep RIE (DRIE), ion beam etching (IBE), and Ar milling (milling). In another example, the dry etching process that may be performed on the wafer W may be atomic layer etching (ALE). In addition, the dry etching process that may be performed on the wafer W may use at least one of $Cl_2$, $HCl$, $CHF_3$, $CH_2F_2$, $CH_3F$, $H_2$, $BCL_3$, $SiCl_4$, $Br_2$, $HBr$, $NF_3$, $CF_4$, $C_2F_6$, $C_4F_8$, $SF_6$, $O_2$, $SO_2$, and $COS$ as the etchant gas.

A metal wiring process may be performed. The metal wiring process may be a process of forming conductive wiring (metal wires) to implement a circuit pattern for operation of a semiconductor device SD. By the metal wiring process, ground, power, and signal transfer paths for operating the semiconductor device SD may be formed. The conductive wiring may include at least one metallic element selected from Au, Pt, Ag, Cu, Al, Ti, Ta, and W.

In some embodiments, in the formation process of the semiconductor device SD, a planarization process, such as a chemical mechanical polish (CMP) process or an etchback process, or an ion implantation process, may be performed.

Referring to FIG. 10 and FIG. 12 together, an internal crack IB may be formed in the wafer W (P20). The internal crack IB may be formed in the scribe lane region SL.

The internal crack in the wafer W may be formed by a multi-pulse laser beam MLB output by any of the wafer processing apparatus 100 shown in FIG. 1 and FIG. 2.

In an embodiment, a pre-grinding process is performed on the back side of the wafer W to reduce the thickness of the wafer W prior to the formation of the internal cracks in the wafer W. The back side may be the surface opposite to the front surface of the wafer W on which the semiconductor device SD is formed.

Referring to FIG. 10 and FIG. 13 together, the semiconductor devices SD may be separated (P30).

After attaching the wafer W with the internal crack IB to the dicing tape DT, the dicing tape DT may be stretched in the horizontal direction to separate the semiconductor devices SD along the internal crack IB. In some embodiments, before attaching the dicing tape DT to the wafer W, a backgrinding process may be additionally performed to polish the back side of the wafer W.

The separated semiconductor device SD may be packaged (P40). The packaging process may include a wire bonding process, a molding process, a marking process, a solder ball mount process, and the like.

As described above, some embodiments are disclosed in the diagrams and specification. While certain terminology has been used to describe the embodiments herein, it is used solely to illustrate the technical ideas of the inventive concept and is not intended to be a limitation of meaning or to limit the scope of the inventive concept as set forth in the claims. Therefore, one of ordinary skill in the art will understand that various modifications and equally valid other embodiments are possible.

What is claimed is:

1. A method of dicing a wafer, the method comprising:
forming a plurality of semiconductor devices in a plurality of device formation regions of a wafer having a scribe lane region defining the plurality of device formation regions;
irradiating a first laser beam and a second laser beam of a wavelength different from the first laser beam along the scribe lane region to form a plurality of internal cracks in the wafer; and
separating the plurality of semiconductor devices along the plurality of internal cracks;
wherein the first laser beam comprises a plurality of pulses sequentially emitted from a laser apparatus, and the second laser beam is continuous wave light that is emitted from the laser apparatus.

2. The method of claim 1, wherein the first laser beam and the second laser beam are irradiated along a same optical path as each other.

3. The method of claim 1,
wherein the first laser beam has a wavelength that is smaller than the second laser beam, and
the second laser beam is irradiated along the scribe lane region prior to each of the plurality of pulses of the first laser beam.

4. The method of claim 1,
wherein the first laser beam is focused at a focusing point that is one point of the scribe lane region, and
the second laser beam is not focused on the focusing point.

5. The method of claim 4,
wherein the second laser beam heats a lower region of the focusing point, and
the second laser beam irradiates the scribe lane region prior to the first laser beam.

6. The method of claim 5, wherein the second laser beam heats the lower region of the focusing point within a range of about 40 Kelvin (K) to about 120 K.

7. The method of claim 1, wherein a portion of the second laser beam overlaps the plurality of pulses of the first laser beam to irradiate the scribe lane region.

8. The method of claim 1,
wherein the first laser beam has a wavelength in a range of about 800 nm to about 1200 nm, and
the second laser beam has a wavelength in a range of about 1400 Nanometer (nm) to about 2000 nm.

9. The method of claim 1, wherein a scanning direction of the second laser beam is identical to a scanning direction of the first laser beam.

10. The method of claim 1,
wherein the plurality of pulses of the first laser beam form a plurality of internal cracks in the scribe lane region, and
the second laser beam heats the plurality of internal cracks and a region between the pluralities of internal cracks.

11. A method of manufacturing a semiconductor device, the method comprising:
forming a plurality of semiconductor devices in a plurality of device formation regions of a wafer having a scribe lane region defining the plurality of device formation regions;
irradiating a first laser beam and a second laser beam along the scribe lane region to form a plurality of horizontally spaced apart internal cracks in the wafer, wherein the first laser beam is pulsed wave light having a wavelength in a range of about 800 Nanometer (nm) to about 1200 nm and comprises a plurality of pulses, and the second laser beam is continuous wave light having a wavelength in a range of about 1400 nm to about 2000 nm;
separating the plurality of semiconductor devices along the plurality of internal cracks; and
packaging each of the plurality of separated semiconductor devices.

12. The method of claim 11,
wherein the second laser beam has power in a range of about 5 Watts (W) to about 10 W, and
the second laser beam heats a lower region of a focusing point within a range of about 40 Kelvin (K) to about 120 K.

13. The method of claim 11, wherein the second laser beam is irradiated to the scribe lane region prior to the plurality of pulses of the first laser beam.

14. The method of claim 11,
wherein the first laser beam and the second laser beam are generated from separate light sources in a laser apparatus and are combined in an optical coupler in the laser apparatus, and
the first laser beam and the second laser beam are emitted from the laser apparatus and have a same optical path to the scribe lane region.

15. The method of claim 11, wherein the first laser beam is irradiated so as to be focused on a focusing point that is one point of the scribe lane region, and the second laser beam is not focused on the focusing point.

16. The method of claim 11, wherein the plurality of pulses of the first laser beam each overlap the second laser beam to irradiate the scribe lane region, and the first laser beam forms a plurality of internal cracks in the scribe lane region.

17. The method of claim 11, further comprising grinding a back side of the wafer, prior to the forming of the plurality of internal cracks in the wafer.

18. A method of manufacturing a semiconductor device, the method comprising:

preparing a wafer having a plurality of device formation regions and a scribe lane region defining the plurality of device formation regions;

forming a plurality of semiconductor devices in a plurality of device formation regions of the wafer having a scribe lane region defining the plurality of device formation regions;

irradiating a first laser beam and a second laser beam along the scribe lane region to form a plurality of horizontally spaced apart internal cracks in the wafer, wherein the first laser beam is pulsed wave light having a wavelength in a range of about 800 Nanometer (nm) to about 1200 nm and comprises a plurality of pulses, and the second laser beam is continuous wave light having a wavelength in a range of about 1400 nm to about 2000 nm;

separating the plurality of semiconductor devices along the plurality of internal cracks; and packaging each of the plurality of separated semiconductor devices, wherein the first laser beam is irradiated so as to be focused on a focusing point that is one point of the scribe lane region, and the second laser beam is not focused on the focusing point but is irradiated along the scribe lane region prior to the plurality of pulses of the first laser beam.

19. The method of claim 18, wherein a portion of the second laser beam overlaps the plurality of pulses of the first laser beam, and the remainder of the second laser beam is not overlapped with the plurality of pulses of the first laser beam.

20. The method of claim 18, wherein the second laser beam heats the scribe lane region without forming the plurality of internal cracks, wherein the second laser beam has power in a range of about 5 Watts (W) to about 10 W, and the second laser beam heats a lower region of the focusing point within a range of about 40 Kelvin (K) to about 120 K.

* * * * *